(12) United States Patent
Ogawa et al.

(10) Patent No.: US 7,977,723 B2
(45) Date of Patent: Jul. 12, 2011

(54) SEMICONDUCTOR DEVICE

(75) Inventors: Hiroyuki Ogawa, Kawasaki (JP); Jun Lin, Kawasaki (JP); Hideyuki Kojima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 354 days.

(21) Appl. No.: 12/354,575

(22) Filed: Jan. 15, 2009

(65) Prior Publication Data

US 2009/0184351 A1    Jul. 23, 2009

(30) Foreign Application Priority Data

Jan. 18, 2008  (JP) ................. 2008-008825

(51) Int. Cl.
*H01L 27/108*  (2006.01)
*H01L 29/76*  (2006.01)
*H01L 29/94*  (2006.01)
*H01L 31/119*  (2006.01)

(52) U.S. Cl. ........................ 257/301; 257/304
(58) Field of Classification Search .......... 257/301–305, 257/E29.345, E21.09
See application file for complete search history.

(56) References Cited

U.S. PATENT DOCUMENTS

| 5,521,111 | A | 5/1996 | Sato |
| 7,015,090 | B2 * | 3/2006 | Okazaki et al. ............. 438/243 |
| 7,304,342 | B2 * | 12/2007 | Nirschl et al. ............. 257/301 |
| 7,884,408 | B2 * | 2/2011 | Tu et al. ..................... 257/304 |
| 2001/0028075 | A1 | 10/2001 | Chen et al. |
| 2004/0155340 | A1 | 8/2004 | Owada et al. |

FOREIGN PATENT DOCUMENTS

| JP | 03-142872 A | 6/1991 |
| JP | 06-97384 A | 4/1994 |
| JP | 06-318679 A | 11/1994 |
| JP | 09-219500 A | 8/1997 |
| JP | 10-22471 A | 1/1998 |
| JP | 2001-244431 A | 9/2001 |
| JP | 2004-172590 A | 6/2004 |
| KR | 10-2003-0082474 A | 10/2003 |
| KR | 10-2004-0059728 A | 7/2004 |

OTHER PUBLICATIONS

M. Wada et al., "A Folded Capacitor Cell (F.C.C.) for Future", 1984, pp. 244-247, VLSI Reasearch Center, Toshiba Corporation, Kawasaki, Japan.
Korean Office Action dated Oct. 28, 2010, issued in corresponding Korean Patent Application No. 10-2009-0002642.

* cited by examiner

*Primary Examiner* — Cuong Q Nguyen
(74) *Attorney, Agent, or Firm* — Westerman, Hattori, Daniels & Adrian, LLP

(57) ABSTRACT

A semiconductor device includes a semiconductor substrate, an active region formed in the semiconductor substrate and extending in a first direction, the active region including a transistor sub-region and a capacitor sub-region, a first trench extending around the transistor sub-region, an isolation layer disposed in the first trench, a second trench extending around the capacitor sub-region, a first transistor including a first insulating layer disposed on the transistor sub-region, the first transistor including a first conductive layer disposed on the first insulating layer, and a first capacitor including a second insulating layer extending over the capacitor sub-region and a sidewall of the second trench, the first capacitor including a second conductive layer disposed on the second insulating layer, the active region having an end portion in the first direction opposite to the transistor sub-region and extending across the first capacitor.

8 Claims, 6 Drawing Sheets

US 7,977,723 B2

SEMICONDUCTOR DEVICE

CROSS-REFERENCE TO RELATED APPLICATION

This application is based upon and claims the benefit of priority of the prior Japanese Patent Application No. 2008-008825 filed on Jan. 18, 2008, the entire contents of which are incorporated herein by reference.

FIELD

An aspect of the embodiments discussed herein is directed to a semiconductor device.

BACKGROUND

In a dynamic random access memory cell having a one-transistor/one-capacitor structure, one of current terminals of an access transistor is connected to a bit line and another one is connected to a storage electrode of a capacitor. In usual, two gate electrodes are provided on a single active region and three source/drain regions are formed such that one of the source/drain regions is located between the gate electrodes and two of the source/drain regions are located outside the gate electrodes, whereby two transistors are formed. The middle source/drain region is used as a common bit line connection region and the outer source/drain regions are connected to capacitors, whereby two memory cells are formed.

Known capacitor structures are a planar type, a trench type, a stack type, and the like. Known isolation techniques are local oxidation of silicon (LOCOS), trench isolation, and the like.

In order to reduce the area occupied by a single memory cell to increase the integration density of memory cells, the area occupied by a single transistor and the area occupied by a single capacitor need to be reduced.

Japanese Laid-open Patent Publication No. 3-142872 discusses that a capacitor is provided on a sidewall of a trench for isolating an access transistor and the trench is used for two purposes: isolation and capacitor mounting.

Japanese Laid-open Patent Publication No. 6-318679 discusses that a local-oxidation-of-silicon (LOCOS)-type field insulating layer defining active regions is formed, transistors are formed in the active regions, a trench is formed around each active region adjacent to the transistors every memory cell, an impurity diffusion region is formed in the trench and coated with a dielectric layer, a counter electrode is formed on the dielectric layer, another dielectric layer and a storage electrode are deposited on the counter electrode in that order, and thereby a capacitor in which the counter electrode is sandwiched between the impurity diffusion region and the storage electrode is formed.

SUMMARY

According to an aspect of an embodiment, a semiconductor device includes a semiconductor substrate, an active region formed in the semiconductor substrate and extending in a first direction, the active region including a transistor sub-region and a capacitor sub-region, a first trench extending around the transistor sub-region, an isolation layer disposed in the first trench, a second trench extending around the capacitor sub-region, a first transistor including a first insulating layer disposed over the transistor sub-region, the first transistor including a first conductive layer disposed over the first insulating layer, and a first capacitor including a second insulating layer extending over the capacitor sub-region and a sidewall of the second trench, the first capacitor including a second conductive layer disposed on the second insulating layer, the active region having an end portion in the first direction opposite to the transistor sub-region and extending across the first capacitor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present technique will now be described with reference to the accompanying drawings.

Figure 1A:
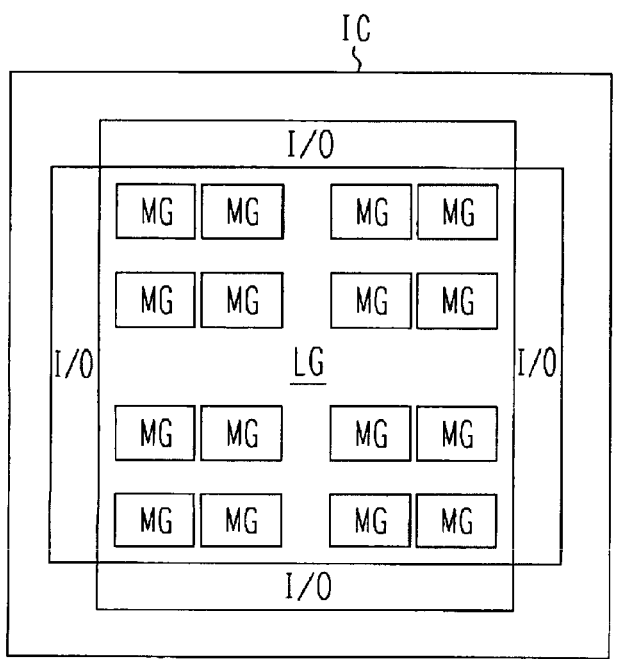
FIG. 1A is a schematic plan view of a memory-merged logic semiconductor device.

FIG. 1A schematically illustrates the configuration of a memory-merged logic semiconductor device IC in plan view. Input-output circuits I/O are arranged along the periphery of the semiconductor device IC and a logic circuit LG including distributed memory sub-circuits MG is located in a center area of the semiconductor device IC.

Figure 1B:
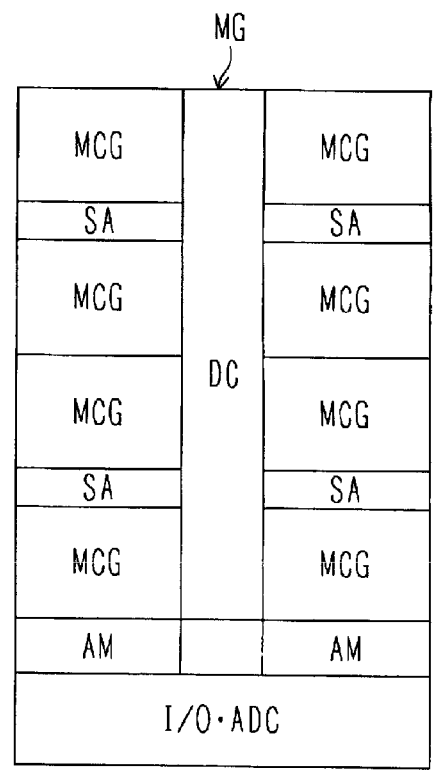
FIG. 1B is a plan view of a memory sub-circuit.

FIG. 1B illustrates the configuration of one of the memory sub-circuits MG. In each memory sub-circuit MG, memory cell groups MCG sandwiching distributed sense amplifiers SA are arranged on both sides of a word decoder DC and second amplifiers AM and an input-output address controller I/O ADC are located near an end of the word decoder DC. In this figure, the second amplifiers AM and the input-output address controller I/O ADC are located near the lower end of the word decoder DC.

Figure 1C:
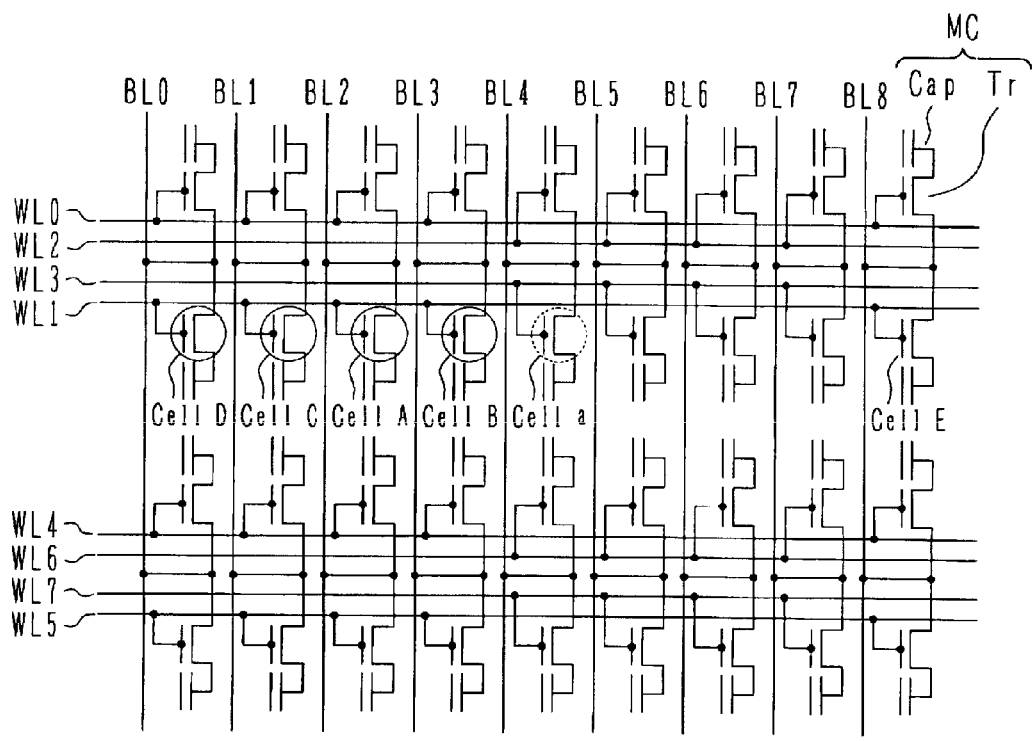
FIG. 1C is an equivalent circuit diagram of the memory sub-circuit illustrated in FIG. 1B.

FIG. 1C illustrates an equivalent circuit of one of the memory cell groups MCG. With reference to FIG. 1C, groups each consisting of four word lines WL extend horizontally and bit lines BL extend vertically. Intersections of the word lines WL and the bit lines BL are each connected to two memory cells MC. The memory cells MC each include a transistor portion Tr and a capacitor portion Cap. The transistor portion Tr includes a current terminal connected to one of the bit lines BL and also includes a gate electrode connected to predetermined one of the word lines WL. The capacitor portion Cap includes a storage electrode connected to another current terminal included in the transistor portion Tr. Another electrode (counter electrode) of the capacitor portion Cap is described as an electrode common to a plurality of capacitors in this embodiment; however, this description is not essential. The bit lines BL are each demarcated into a plurality of sections and therefore parasitic capacitors are small. The number of the transistor portions Tr connected to each bit line BL is small. This also allows the parasitic capacitors to be small. It is effective in reducing noise that the bit line BL is bent into a bent bit line structure. However, this is not a requirement essential for the present application.

Figure 2A:
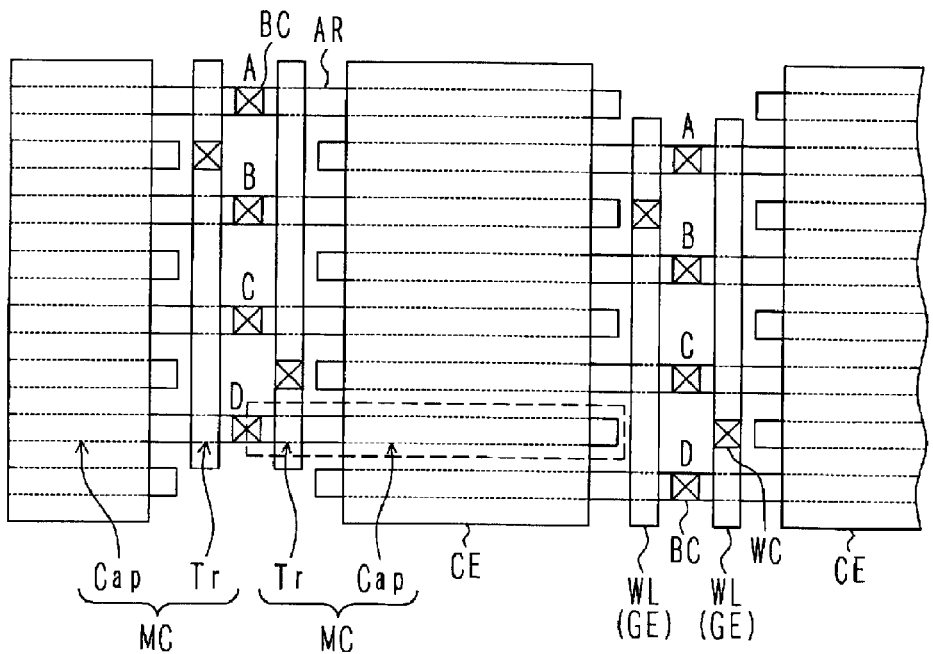
FIG. 2A is a plan view of the arrangement of memory cell groups.
Figure 2B:
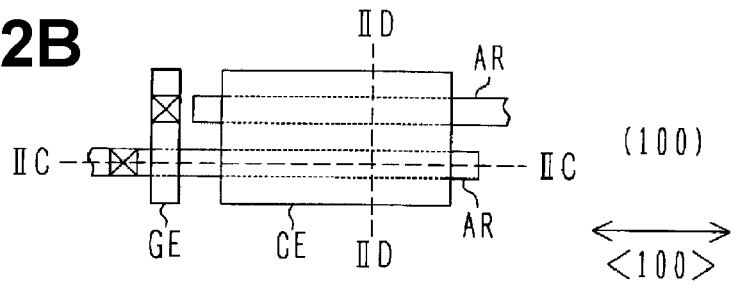
FIG. 2B is a plan view of a portion of FIG. 2A.

FIG. 2A illustrates the arrangement of the memory cell groups MCG in plan view. FIG. 2B illustrates a portion of FIG. 2A. With reference to FIGS. 2A and 2B, a plurality of narrow active regions AR extend horizontally and are vertically arranged at a predetermined pitch. The horizontal positions (row positions) of the active regions AR alternately vary every other row.

A silicon substrate for forming the logic circuit LG is usually a (001) substrate having a principal surface oriented in the (001) plane. The active regions AR preferably extend in the <010> or <100> direction.

Each active region AR includes a bit line contact sub-region BC located at the center thereof and also includes the memory cells MC which are arranged on both sides of the bit line contact sub-region BC and which include the transistor portions Tr and the capacitor portions Cap. The active regions AR, which are vertically arranged, alternately vary in horizontal position and are alternately aligned with each other. The active regions AR have linear sides. The width of each transistor portion Tr is equal to that of each capacitor portion Cap. If surrounding portions of the active regions AR, which extend in the <010> or <100> direction, are etched perpendicularly to the surfaces of the surrounding portions, the sidewalls of the etched surrounding portions are substantially oriented in the (110) or (010) plane.

Counter electrodes CE are arranged to partly overlap with the active regions AR and are each shared by the capacitor portions Cap, which are located under the counter electrodes CE. The counter electrodes CE are arranged so as not to cover end portions of the active regions AR. The capacitor portions Cap are arranged in columns such that the horizontal positions thereof are aligned with each other. The bit line contact sub-regions BC are alternately arranged on both sides of the capacitor portions Cap. Regions above and below each bit line contact sub-region BC are STI regions that separate the active regions AR from each other in the longitudinal direction thereof.

The following structure may be used: a folded bit line structure in which the bit lines BL are arranged in rows and those arranged in two rows are folded back. With reference to FIG. 2A, the bit line contact sub-regions BC arranged in adjacent two rows represented by A-A or B-B are connected to one of the bit lines BL.

Since the active regions AR alternately vary in horizontal position, the bit line contact sub-regions BC are alternately arranged on both sides of the counter electrodes CE. That is, the capacitor portions Cap, which are arranged in the column direction, are alternately connected to the transistor portions Tr located on the left or right thereof. Symbols A, B, C, and D attached to the bit line contact sub-regions BC arranged in every two rows indicate that these bit line contact sub-regions BC are connected to folded bit lines A, B, C, and D.

The word lines WL are arranged on both sides of the bit line contact sub-regions BC and function as gate electrodes GE for the transistor portions Tr, which are located under the word lines WL. The word lines WL each have a word line contact region WC.

Figure 2C:
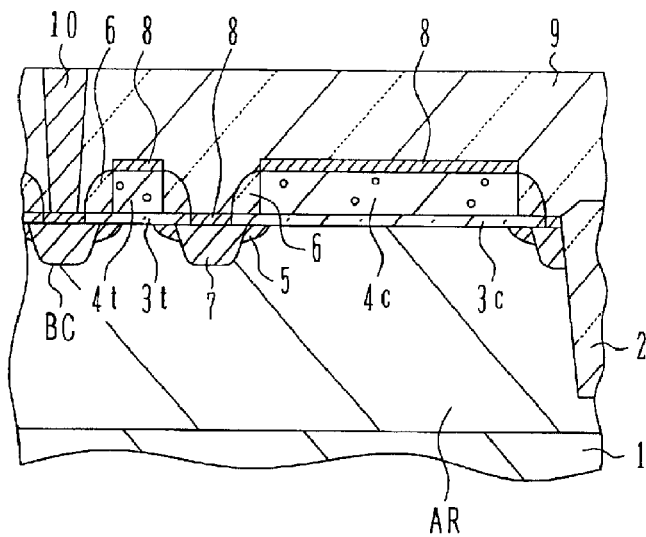
FIG. 2C is a sectional view of an active region taken along the line IIC-IIC of FIG. 2B.
Figure 2D:
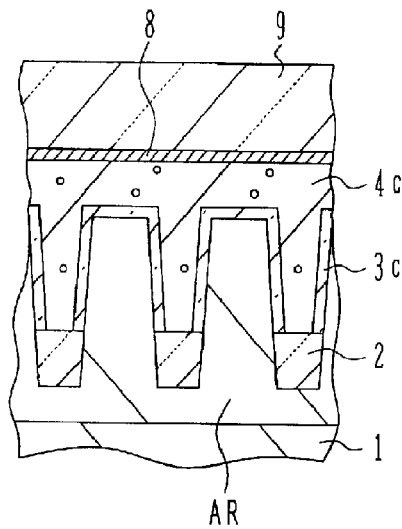
FIG. 2D is a sectional view of a capacitor taken along the line IID-IID of FIG. 2B.

FIG. 2B is a plan view of portions of two of the memory cells MC arranged in the column direction. A longitudinal half of each active region AR, that is, a portion from the bit line contact sub-region BC to an end of the active region AR is illustrated in this figure. FIG. 2C is a sectional view taken along the line IIC-IIC of FIG. 2B. FIG. 2D is a sectional view of the capacitor portions Cap taken along the line IID-IID of FIG. 2B.

With reference to FIG. 2C, the active regions AR are disposed on a silicon substrate 1. The bit line contact sub-regions BC are located at substantially the centers of the active regions AR and serve as one-side source/drain regions. When the memory cells MC are a p-type or an n-type, the active regions AR are an n-type or a p-type, respectively, and the bit line contact sub-regions BC are a p-type or an n-type, respectively. Insulated gate electrodes including gate-insulating layers 3t and gate electrodes 4t disposed thereon are arranged on the right side of the bit line contact sub-regions BC. Other-side source/drain regions 7 are arranged on the right side of the insulated gate electrodes. When the memory cells MC are an n-type or a p-type, the source/drain regions 7 are an n-type or a p-type, respectively.

In particular, the insulated gate electrodes, which include the gate-insulating layers 3t and the gate electrodes 4t, are formed, extensions 5 are formed in the active regions AR so as to located on both sides of the insulated gate electrodes, sidewall spacers 6 are formed on sidewalls of the second side surface 4, and the bit line contact sub-regions BC and the source/drain regions 7 are formed by ion implantation. When the memory cells MC are an n-type or a p-type, the extensions 5 are an n-type or a p-type, respectively.

Capacitor dielectric layers 3c and counter electrodes 4c are arranged on the side opposite to the gate electrodes 4t with the source/drain regions 7 located therebetween. Silicide regions 8 made of a silicide such as CoSi are formed over the bit line contact sub-regions BC, the source/drain regions 7, and the counter electrodes 4c. A lower interlayer insulating layer 9 is deposited over the memory cells MC, contact holes are formed in the lower interlayer insulating layer 9 by etching such that the bit line contact sub-regions BC are exposed through the contact holes, and conductive plugs 10 such as tungsten plugs are then provided in the contact holes.

The transistor portions Tr of the memory cells MC may be fabricated in a single operation together with n-type MOS transistor NMOS included in the logic circuit LG. When the memory cells MC are a p-type, p-type MOS transistor PMOS are fabricated instead of the n-type MOS transistor NMOS. The source/drain regions of the transistor portions Tr may be fabricated in a single operation together with extensions of logic transistors. Ion implantation are performed to form the source/drain regions of the logic transistors but need not be performed to form the memory cells MC.

With reference to FIG. 2D, trenches are arranged around the active regions AR and STI insulating layers 2 are placed in the trenches. In capacitor regions, the STI insulating layers 2 are etched back so as to have bottom portions having a thickness sufficient for element isolation and recessed portions are formed such that sidewalls of the active regions AR are exposed through the recessed portions. The recessed portions preferably have a depth greater than the width of the active regions AR and more preferably two times greater than the width of the active regions AR. The capacitor dielectric layers 3c are formed over the active regions AR and the active region sidewalls exposed through the recessed portions. The counter electrodes 4c are formed on the capacitor dielectric layers 3c. The silicide regions 8 are formed on the counter electrodes 4c as well as the gate electrodes 4t.

The capacitor regions are covered with the counter electrodes 4c and therefore are not subjected to ion implantation for forming the extensions 5 and the source/drain regions 7. The capacitor regions supply the counter electrodes 4c with voltages sufficient to turn on transistors to induce channels, thereby creating a capacitance between each channel and counter electrode 4c. Since ion implantation is not performed to form the capacitor portions Cap, the impurity concentration of the capacitor portions Cap of the active regions AR is low. The width of the active regions AR may be selected such that depletion layers extending from sidewalls, opposed to each other, having the counter electrodes 4c are connected to each other. In this case, the depletion layers are connected to each other in the thickness direction thereof.

This embodiment is as described above. According to this embodiment, the counter electrodes CE are arranged so as not to cover the end portions of the active regions AR that extend in a first direction; hence, if a mask used to pattern the counter electrodes CE is misaligned, the formed capacitor portions Cap may be prevented from being varied in capacitance. When the active regions AR have a rectangular shape with linear sides, the number of corners to be rounded may be reduced; hence, etching accuracy may be readily increased. Patterning may be readily performed.

Capacitors formed in the recessed portions, which have a depth greater than the width of the active regions AR, have an increased capacitance as compared to capacitors formed on the active regions AR. When the recessed portions have a depth two times greater than the width of the active regions AR, the capacitance of the capacitors formed on the active regions AR may be increased by five times or more.

If the capacitor dielectric layers 3c are formed on a (001) silicon substrate and the sidewalls of the active regions AR that are substantially oriented in the (100) or (010) plane, thin insulating layers may be precisely formed, because the (100) crystal orientation, the (010) plane, and the (001) plane have an oxidation rate less than that of other plane.

Each bit line contact sub-region BC has spaces arranged in the column direction; hence, positional allowances for forming bit contacts are large. Furthermore, the distance between upper interconnects is large. This allows the capacitance between the interconnects to be small.

If complete depletion capacitors in which depletion layers present in the capacitor portions Cap are in contact with each other are provided between the capacitors formed on the sidewalls of the active regions AR, advantages below may be achieved.

A first advantage is a reduction in the threshold voltage of the capacitor portions Cap. Capacitances are created in such a manner that the channels are formed in the capacitor portions Cap by applying voltages to the counter electrodes 4c as described above. The reduction of the threshold voltage thereof allows the voltages applied to the counter electrodes 4c to be reduced. The reduction of the voltages applied to the counter electrodes 4c may lead to a reduction in the capacitor dielectric layers 3c.

A second advantage is an increase in refresh time. Stored charges are gradually reduced because of the leakage of currents. In particular, some cells lose charges at a high rate due to metal impurities and/or crystal defects as well known. The use of the complete depletion capacitors allows charges to be stored in the depletion layers without depending on the presence of such metal impurities and/or crystal defects; hence, the charges may be prevented from flowing into a substrate.

Operations of fabricating the memory cells MC illustrated in FIGS. 2A to 2D are described below.

Figure 3A:
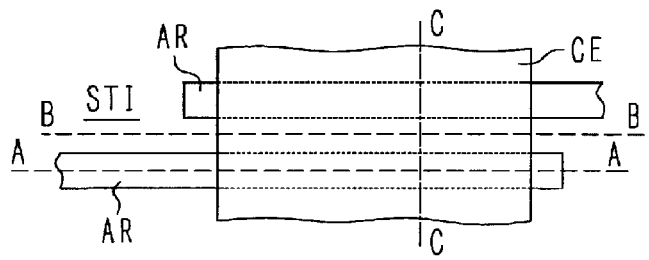
FIG. 3A is a plan view of memory cells.
Figure 3B:
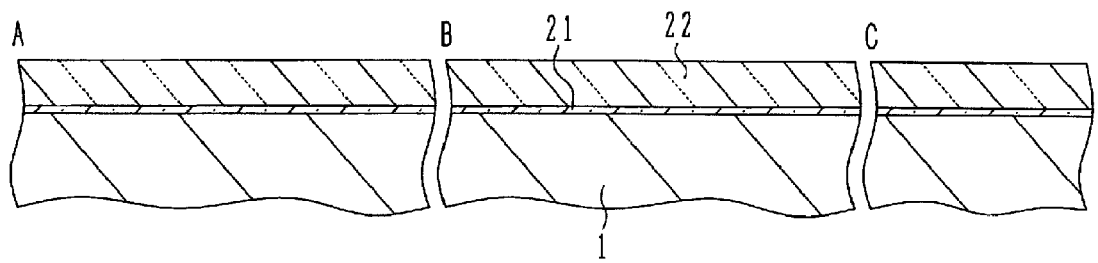
FIGS. 3B-3L are sectional views illustrating operations of fabricating the memory cells illustrated in FIGS. 2A-2D.
Figure 3C:
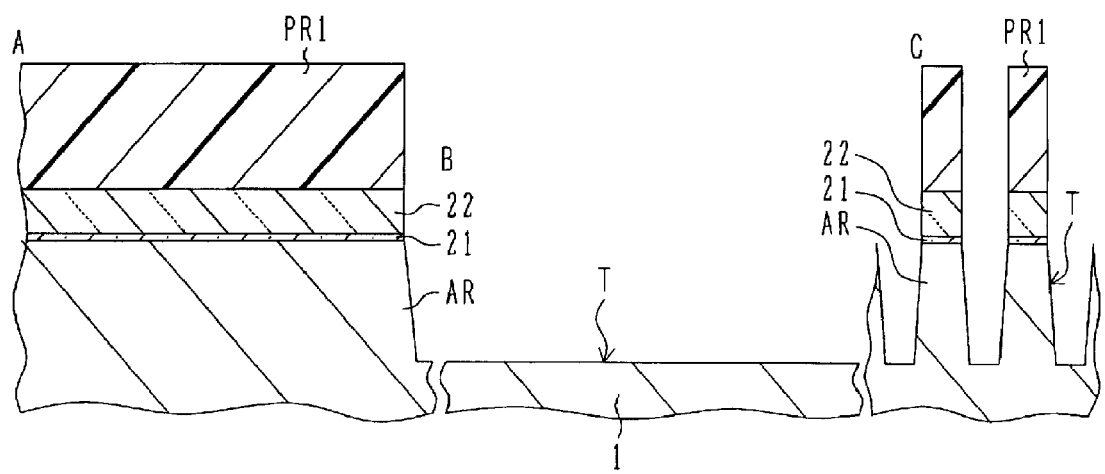
Figure 3D:
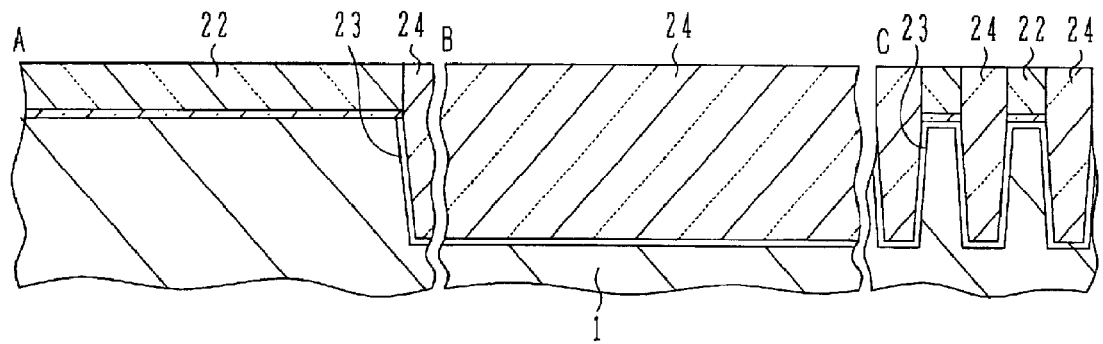

FIG. 3A, as well as FIG. 2B, is a plan view of portions of the memory cells MC. FIG. 3A illustrates two of the active regions AR vertically arranged, the STI regions surrounding the active regions AR, and the counter electrodes CE of the capacitor portions Cap. The active regions AR have a width of about 70 to 110 nm and a length of about 1,000 nm to 2,000 nm. The active regions AR surrounded by the STI regions, that is, shallow trench isolation (STI) regions. The STI regions, which are each located between the active regions AR, have a width of about 70 nm to 110 nm and a length of about 300 nm to 700 nm. FIGS. 3B, 3C, and 3D are sectional views taken along the lines A-A, B-B, and C-C, respectively, of FIG. 3A.

As illustrated in FIG. 3B, a surface of the (001) silicon substrate 1 is thermally oxidized, whereby a buffer oxide layer 21 with a thickness of 5 nm to 20 nm is formed. A silicon nitride layer 22 with a thickness of 50 nm to 200 nm is deposited on the buffer oxide layer 21 at a temperature of 600° C. to 800° C. by thermal chemical vapor deposition (TCVD) using source gases such as a silane-containing gas and an ammonia gas. In this stage, the silicon substrate 1 has a uniform structure.

As illustrated in FIG. 3C, a resist pattern PR1 corresponding to the active regions AR is formed on the silicon nitride layer 22. The silicon nitride layer 22 and the buffer oxide layer 21 are patterned by dry etching using an etching gas containing, for example, tetrafluorocarbon ($CF_4$), whereby a hard mask is formed. In this stage, the resist pattern PR1 may be stripped off such that the hard mask remains. Portions of the silicon substrate 1 that are exposed from the hard mask are dry-etched using an etching gas containing hydrogen bromide (HBr) and chlorine ($Cl_2$), whereby trenches T having a depth of about 150 nm to 350 nm are formed so as to surround the active regions AR. If pieces of the resist pattern PR1 remain, the resist pattern pieces are removed with a resist-stripping solution, by ashing, or by another technique. As illustrated in FIG. 3C, the trenches T preferably have a depth greater than the width of the active regions AR and more preferably, for example, two times greater than the width thereof.

As illustrated in FIG. 3D, silicon oxide layer liners 23 with a thickness of about 2 nm to 10 nm are formed on exposed surface portions of the silicon substrate 1 by thermal oxidation as required. An HDP silicon oxide layer is deposited over the silicon oxide layer liners 23 by high-density plasma (HDP)-enhanced chemical vapor deposition (CVD) using a silane-containing gas and oxygen or a TEOS silicon oxide layer (hereinafter simply referred to as a silicon oxide layer 24) is deposited over the silicon oxide layer liners 23 by CVD using tetraethoxysilane (TEOS) and oxygen, whereby the trenches T are filled with portions of the silicon oxide layer 24. The silicon nitride layer 22, which functions as a CMP stopper, is exposed by chemical mechanical polishing (CMP). The silicon oxide layer liners 23 are not illustrated in figures subsequent to FIG. 3D.

Figure 3E:
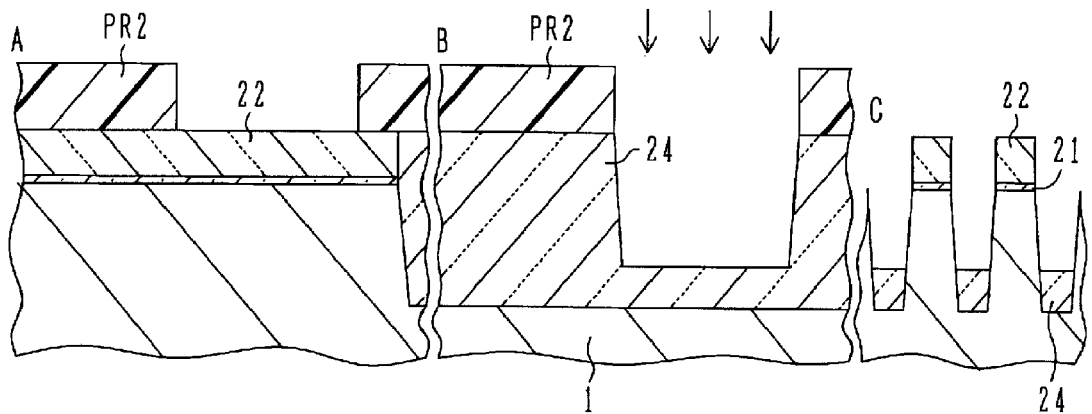

As illustrated in FIG. 3E, resist pattern PR2 with openings having substantially the same shape as that of the counter electrodes CE illustrated in FIG. 3A is formed. Portions of the silicon oxide layer 24 that are exposed through the openings are etched using an etching gas containing, for example, hexafluorobutadiene ($C_4H_6$) such that bottom parts of the etched portions that have a thickness of about 50 nm to 150 nm remain, whereby sidewalls of the active regions AR are exposed. In this etching operation, the silicon nitride layer 22 functions as an etching mask. The resist pattern PR2 is then stripped off.

Figure 3F:
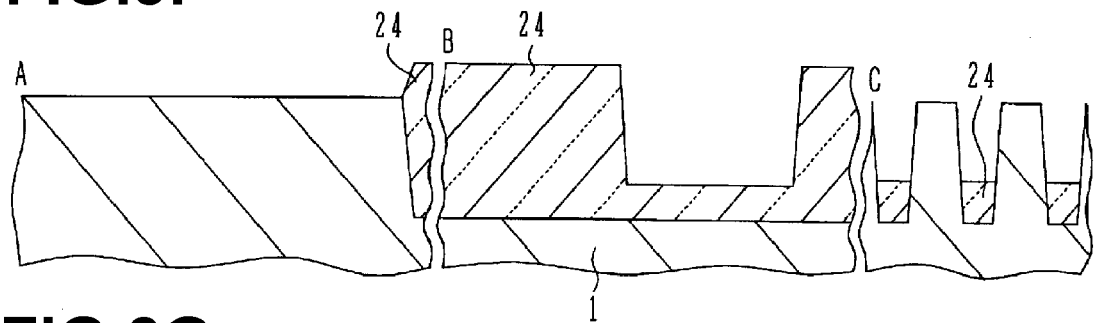

As illustrated in FIG. 3F, the silicon nitride layer 22 is boiled in phosphoric acid or a solution mixture of phosphoric acid and fluoric acid, whereby the silicon nitride layer 22 is washed out. The buffer oxide layer 21 is then washed out with diluted fluoric acid. In this operation, although the silicon oxide layer 24 is slight etched, most of the silicon oxide layer 24 remains.

Figure 3G:
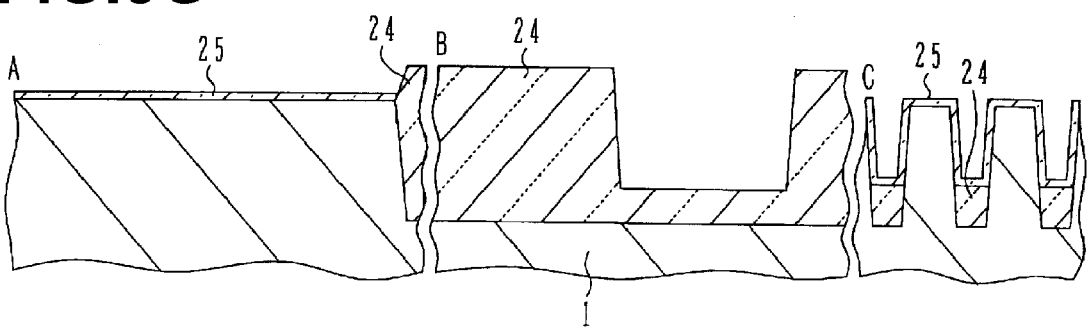

As illustrated in FIG. 3G, exposed surface portions of the silicon substrate 1 are thermally oxidized, whereby sacrificial silicon oxide layers 25, having a thickness of about 5 nm to 10 nm, for ion implantation are formed.

Figure 3H:
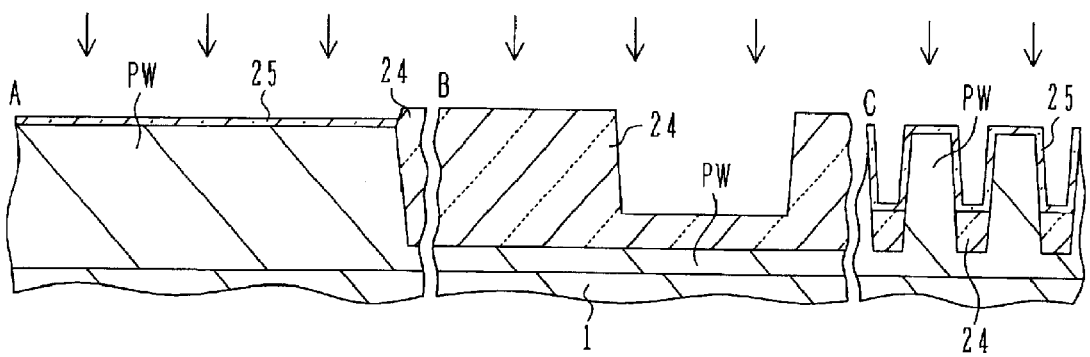

As illustrated in FIG. 3H, ions of a p-type impurity are implanted into the silicon substrate 1 through the sacrificial silicon oxide layers 25 several times in such a manner that the acceleration energy of the impurity ions is varied, whereby p-type wells PW are formed. When the memory cells MC are a p-type, ions of an n-type impurity are implanted into the silicon substrate 1, whereby n-type wells NW are formed. The sacrificial silicon oxide layers 25 are then stripped off.

Figure 3I:
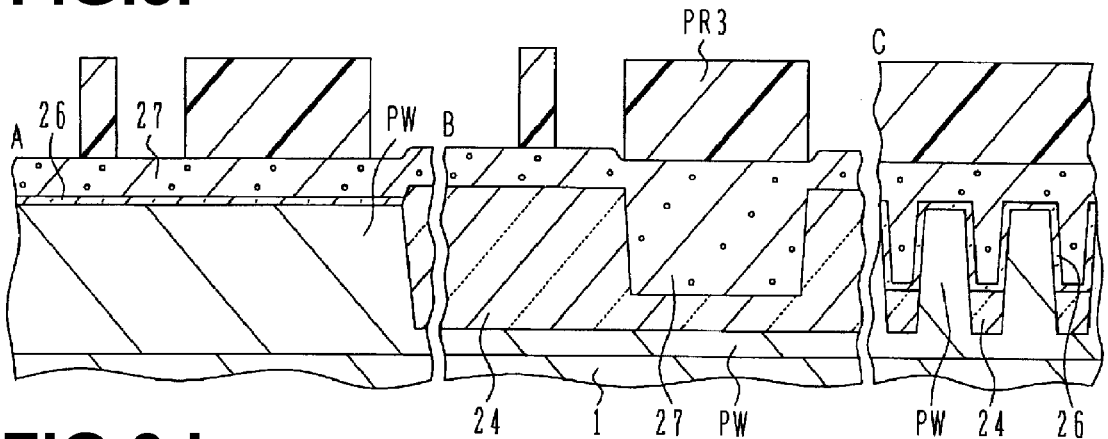

As illustrated in FIG. 3I, exposed surface portions of the silicon substrate 1 are cleaned and then thermally oxidized, whereby gate oxide layers 26 with a thickness of about 2 nm to 7 nm are formed. A polycrystalline silicon layer 27 with a thickness of about 70 nm to 150 nm is deposited on the gate oxide layers 26 at a substrate temperature of 400° C. to 750° C. by TCVD using a silane-containing gas and hydrogen. Amorphous silicon may be deposited over the gate oxide layers 26 and then crystallized by heat treatment. A resist pattern PR3 corresponding to the word lines WL and counter electrodes CE is formed on the polycrystalline silicon layer 27. A pattern for forming the counter electrodes CE has substantially the same size as that of openings for forming recessed portions for capacitors. Since the silicon oxide layer 24 is slightly etched, the recessed portions have an increased width. An increase in the width thereof enlarges misalignment. The thickness of the polycrystalline silicon layer 27 is preferably selected such that the trenches T are filled with portions of the polycrystalline silicon layer 27. The polycrystalline silicon layer 27 is etched using the resist pattern PR3 as a mask, whereby gate electrodes G (the word lines WL) and the counter electrodes CE are formed by patterning. The resist pattern PR3 is then stripped off. A hard mask may be formed in such a manner that a silicon nitride layer or the like is formed under the resist pattern PR3.

Figure 3J:
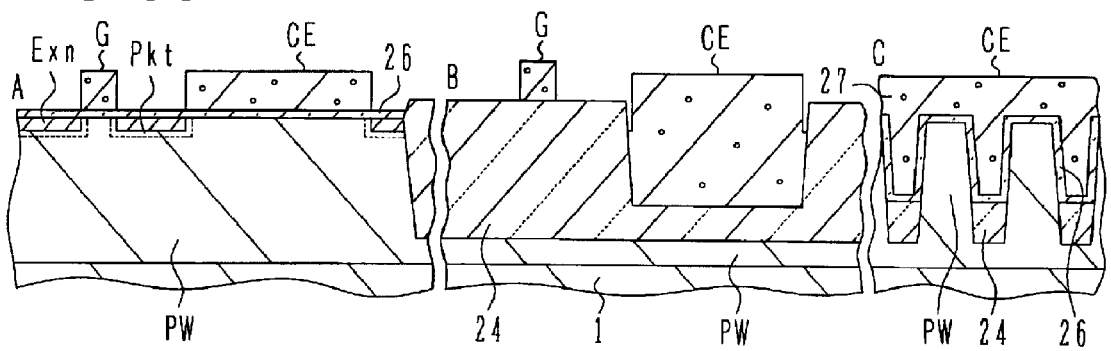

As illustrated in FIG. 3J, ions of an n-type impurity such as As are implanted into the silicon substrate 1 using the gate electrodes G and the counter electrodes CE as a mask, whereby n-type extensions Exn are formed. When the memory cells MC are a p-type, ions of a p-type impurity such as B are implanted into the silicon substrate 1. Furthermore, p-type pocket regions Pkt may be formed so as to surround the n-type extensions Exn in such a manner that ions of a p-type impurity such as In are implanted into the silicon substrate 1 at an angle. When the memory cells MC are a p-type, n-type pocket regions are formed in such a manner that ions of an n-type impurity such as P are implanted into the silicon substrate 1. The pocket regions, as well as the wells, are conductive and therefore are not illustrated in figures subsequent to FIG. 3J. No ions are implanted into the active regions AR of the capacitor portions Cap covered with the counter electrodes CE. The silicon substrate 1 is subjected to rapid thermal annealing (RTA) at a temperature of 900° C. to 1,100° C. for a time of one second or less to 15 seconds, whereby the implanted impurity ions are activated.

Figure 3K:
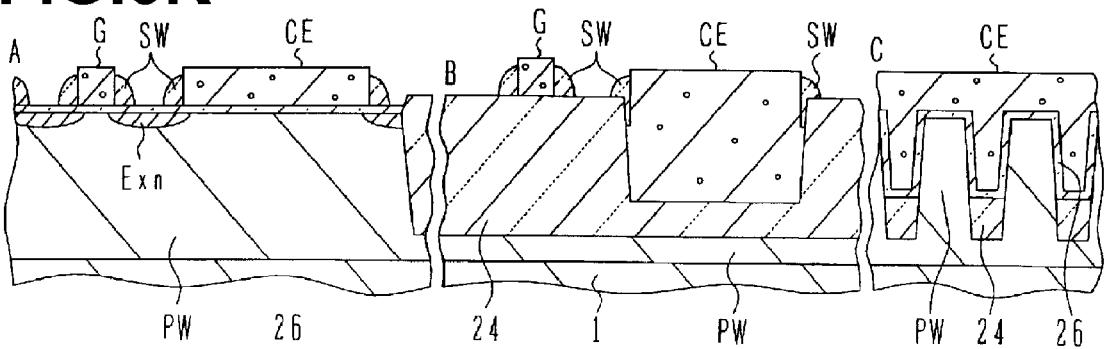

As illustrated in FIG. 3K, an insulating layer made of silicon dioxide, silicon nitride, or the like is deposited over the gate electrodes G and the silicon substrate 1 so as to have a thickness of about 30 nm to 80 nm and then subjected to isotropic etching such as reactive ion etching such that sidewall spacers SW are allowed to remain on sidewalls of the gate electrodes G and sidewalls of the counter electrodes CE. Instead, known sidewall spacers such as multilayer sidewall spacers may be formed.

Figure 3L:
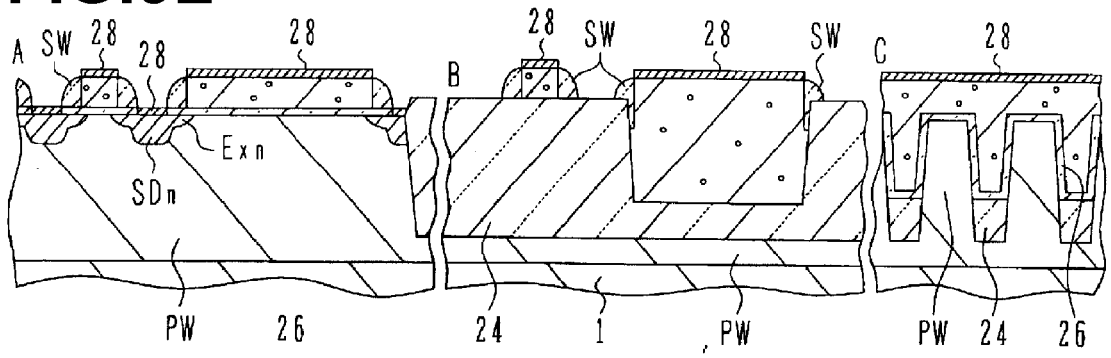

As illustrated in FIG. 3L, ions of an n-type impurity such as P are implanted into the silicon substrate 1 using the sidewall spacers SW as a mask, whereby low-resistance source/drain regions SDn are formed. When the memory cells MC are a p-type, the low-resistance source/drain regions SDn are formed in such a manner that ions of a p-type impurity such as B are implanted into the silicon substrate 1. The low-resistance source/drain regions SDn are activated as required. After oxides on the silicon substrate 1 are stripped off, a Co or Ni layer is formed on the silicon substrate 1 by sputtering or the like and then heat-treated so as to be silicidized. Unreacted portions are washed out. The silicidized Co or Ni layer is heat-treated again, whereby the silicide layer 28 is formed.

The memory cells MC are formed as described above. In the case where the memory cells MC are integrated into a CMOS logic circuit, NMOS transistors included in a logic circuit and the transistor portions Tr of the memory cells MC may be formed in a common operation. When the memory cells MC are a p-type, PMOS transistors are formed. In this embodiment, channels are formed in surface portions of the silicon substrate 1 by applying predetermined potentials to the counter electrodes 4c formed in the capacitor regions, whereby transistors are connected to capacitors. In another way, surface portions of the silicon substrate 1 that correspond to the capacitor regions may be doped with an impurity such that the sources and drains of the transistors are electrically connected to each other. The lower interlayer insulating layer 9 is formed over the memory cells MC and the MOS transistors of the logic circuit, the contact holes are formed in the lower interlayer insulating layer 9 by etching, and conductive plugs 10 are then provided in the contact holes, whereby a configuration illustrated in FIG. 2C is obtained.

Multilevel interconnects are formed by, for example, a process described in an example discussed in Japanese Laid-open Patent Publication No. 2004-172590 (U.S. Pat. No. 6,949,830).

The present technique is as described above. The present technique is not limited to the embodiments. It is apparent to those skilled in the art that various modifications, improvements, replacements, combinations, and the like may be made.

In the configuration illustrated in FIG. 2A in plan view, the horizontal positions of the active regions AR alternately vary every other row.

Figure 4:
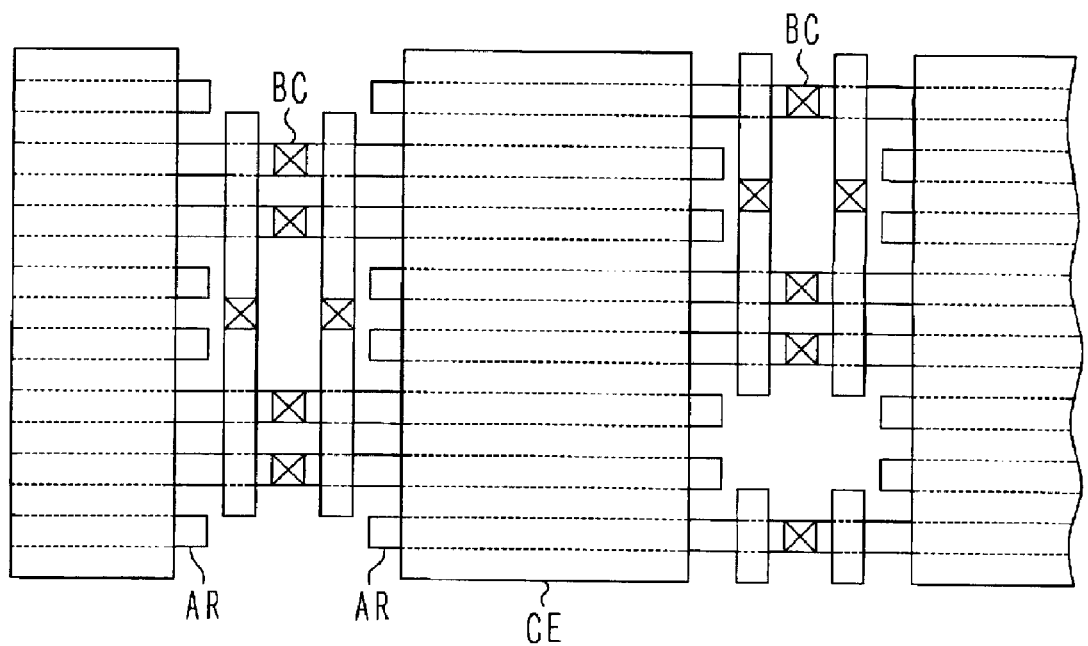
FIG. 4 is a plan view of a substrate according to a modification.

FIG. 4 illustrates another configuration in plan view. The horizontal positions of active regions AR vary every two rows. In this case, spaces are present above and below bit line contact sub-regions BC; hence, allowances for forming contacts in this configuration are substantially equal to those in the configuration illustrated in FIG. 2A. Capacitors have substantially the same configuration as that described in the above embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
a semiconductor substrate;
an active region formed in the semiconductor substrate and extending in a first direction, the active region including a transistor sub-region and a capacitor sub-region;
a first trench extending around the transistor sub-region;
an isolation layer disposed in the first trench;
a second trench extending around the capacitor sub-region;
a first transistor including a first insulating layer disposed on the transistor sub-region, the first transistor including a first conductive layer disposed on the first insulating layer; and
a first capacitor including a second insulating layer extending over the capacitor sub-region and a sidewall of the second trench, the first capacitor including a second conductive layer disposed on the second insulating layer, the active region having an end portion in the first direction opposite to the transistor sub-region and extending across the first capacitor.

2. The semiconductor device according to claim 1, wherein the active region has sides that are linear in plan view and the transistor sub-region has a first width and the capacitor sub-region has a second width equal to the first width.

3. The semiconductor device according to claim 1, further comprising a third insulating extending on a bottom portion of the second trench,
wherein the third insulating layer is thicker than the second insulating layer.

4. The semiconductor device according to claim 1, wherein the second conductive layer extends perpendicularly to the first direction.

5. The semiconductor device according to claim 1, wherein the active region includes a contact region located at the center thereof when viewed in the first direction, a second transistor located on the side opposite to the first transistor with the contact region disposed therebetween, and a second capacitor located on the side opposite to the first capacitor with the contact region disposed therebetween.

6. The semiconductor device according to claim 1, wherein the principal surface of the semiconductor substrate includes a first plane oriented in a first direction and a sidewall of the active region has a second plane oriented in a second direction, the first and second plane having an oxidation rate less than that of other planes oriented in different directions.

7. The semiconductor device according to claim 6, wherein the first insulating layer and the second insulating layer have a thickness of 2 nm to 7 nm.

8. A semiconductor device comprising:
a semiconductor substrate;
an active region extending in a first direction, the active region extending a transistor sub-region and a capacitor sub-region;
a first trench extending around the transistor sub-region;
an isolation layer disposed in the first trench;
a second trench extending around the capacitor sub-region;
a first transistor including a first insulating layer disposed on the transistor sub-region, the first transistor including a first conductive layer disposed on the first insulating layer; and
a first capacitor including a second insulating layer extending over the capacitor sub-region and a sidewall of the second trench, the first capacitor including a second conductive layer disposed on the second insulating layer,
wherein the active region has a first end portion which is located in the first direction and which projects out of a second end portion of the second conductive layer.

* * * * *